(12) United States Patent
Moser et al.

(10) Patent No.: US 11,108,383 B1
(45) Date of Patent: Aug. 31, 2021

(54) CLOCK PHASE CONTROL

(71) Applicant: BAE Systems Information and Electronic Systems Integration Inc., Nashua, NH (US)

(72) Inventors: David D. Moser, Haymarket, VA (US); Michael J. Frack, Reva, VA (US); Mark R. Shaffer, Culpeper, VA (US); Daniel L. Stanley, Warrenton, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 17/025,049

(22) Filed: Sep. 18, 2020

(51) Int. Cl.
| | |
|---|---|
| *H03K 5/13* | (2014.01) |
| *H03K 5/01* | (2006.01) |
| *H03K 19/21* | (2006.01) |
| *G06F 1/06* | (2006.01) |
| *G06F 1/08* | (2006.01) |
| *G11C 19/28* | (2006.01) |
| *H03K 5/00* | (2006.01) |

(52) U.S. Cl.
CPC ................. *H03K 5/01* (2013.01); *G06F 1/06* (2013.01); *G06F 1/08* (2013.01); *G11C 19/28* (2013.01); *H03K 19/21* (2013.01); *H03K 2005/00286* (2013.01)

(58) Field of Classification Search
CPC ..................... H03K 5/01; H03K 19/21; H03K 2005/00286; G06F 1/08; G06F 1/06; G11C 19/28

USPC .......................................................... 327/256
See application file for complete search history.

(56) References Cited

U.S. PATENT DOCUMENTS

| | | | |
|---|---|---|---|
| 8,471,607 B1* | 6/2013 | Pace | H03K 21/026 327/115 |
| 8,803,579 B2 | 8/2014 | Moser et al. | |
| 10,236,895 B1* | 3/2019 | Rogers | H03L 7/081 |
| 2008/0265967 A1* | 10/2008 | Goller | G11C 7/10 327/295 |
| 2010/0057384 A1* | 3/2010 | Inukai | G01C 19/5607 702/56 |
| 2011/0179868 A1* | 7/2011 | Kaino | G01C 19/5607 73/504.12 |
| 2019/0199356 A1* | 6/2019 | Robin | H03K 21/08 |

* cited by examiner

*Primary Examiner* — Ryan Jager
(74) *Attorney, Agent, or Firm* — Finch & Maloney PLLC; Scott J. Asmus (57) ABSTRACT

A clock phase control circuit includes a clock input gate module, first and second shift register divider modules, and a multiplexer. The clock input gate module is configured to produce, based on an oscillating input clock signal, first and second intermediate clock signals. The first shift register divider module is configured to produce at least one first phase clock signal based on the first intermediate clock signal, where the at least one first phase clock signal has a different frequency than the first intermediate clock signal. The second shift register divider module is configured to produce at least one second phase clock signal based on the second intermediate clock signal, where the at least one second phase clock signal has a different frequency than the second intermediate clock signal. The multiplexer is configured to produce an output clock signal by selecting one of the first or second phase clock signals.

19 Claims, 8 Drawing Sheets

CLOCK PHASE CONTROL

STATEMENT OF GOVERNMENT INTEREST

This invention was made with United States government support under sub-contract no. BB01050632 awarded by the Defense Advanced Research Projects Agency (DARPA). The United States government has certain rights in the invention.

FIELD OF THE DISCLOSURE

This disclosure relates generally to programmable logic devices, and more particularly, to a clock phase control circuit.

BACKGROUND

In some electronic systems, such as wireless communications, the phase and/or the frequency of a clock used to generate or recover a signal must be shifted or otherwise modified. With a periodic clock signal, conventional phase locked loop (PLL) circuits can produce multiple phase outputs that are out-of-phase with the input. Such PLL circuits are relatively accurate and can track over a range of environmental conditions (e.g., temperature). However, some PLLs are complex, physically large, consume a large amount of power, and are designed to produce a limited and unchangeable number of output phases. Furthermore, porting some PLLs into new technologies can be expensive and difficult to implement. Another approach is to use delay lines, which while more compact than PLLs, do not perform well across a wide range of environmental conditions, require frequent calibration, and do not maintain constant phase with a variable clock frequency because the output phase changes with the clock speed.

DETAILED DESCRIPTION

In accordance with an embodiment of the present disclosure, a programmable clock phase control circuit includes a clock input gate module, a first shift register divider module, a second shift register divider module, and a multiplexer. The clock input gate module is configured to produce, based on an oscillating input clock signal, a first intermediate clock signal and a second intermediate clock signal. The first shift register divider module is configured to produce at least one first phase clock signal based on the first intermediate clock signal, where the at least one first phase clock signal has a different frequency than the first intermediate clock signal. The second shift register divider module is configured to produce at least one second phase clock signal based on the second intermediate clock signal, where the at least one second phase clock signal has a different frequency than the second intermediate clock signal. The multiplexer is configured to produce an output clock signal by selecting one of the first phase clock signal(s) or one of the second phase clock signal(s). Numerous variations will be appreciated.

General Overview

Phase control is a technique for delaying a clock signal and/or changing its frequency. Phase control is useful in applications such as source synchronous communication interfaces. As noted above, conventional clock phase control circuits, such as PLLs, can be physically large, expensive to manufacture, and can consume a large amount of power. For example, some conventional analog PLL designs are relatively large (e.g., on the order of 150-250 nanometers), do not have a programmable delay, are very slow, and are susceptible to temperature variations during operation. Notably, many of these PLL designs produce a limited and fixed number of phase outputs, such as 0-, 90-, 180-, and 270-degree phases. Other conventional solutions, such as delay lines, are simple in design but difficult to calibrate and control, especially under varying environmental conditions. Therefore, such conventional solutions are not suitable for very small-scale applications or when a programmable phase delay is needed.

To this end, techniques for controlling the phase of a clock are disclosed, including clock phase control circuits that are programmable both in phase and frequency, track well over a wide range of environmental conditions, port easily to new technologies (including nanoscale, such as 45 nanometers or smaller), use low amounts of power, and track output phase with changes in the input clock frequency. As will be appreciated, the disclosed circuits are easily testable, designed to work well with low-voltage differential signaling (LVDS) and complementary metal-oxide-semiconductor (CMOS) interfaces, and interface well with existing technology, such as synchronous dynamic random-access memory (SDRAM) and peripheral component interconnect (PCI) busses. Numerous embodiments and configurations will be apparent in light of this disclosure.

Clock Phase Control Circuit

Figure 1A:
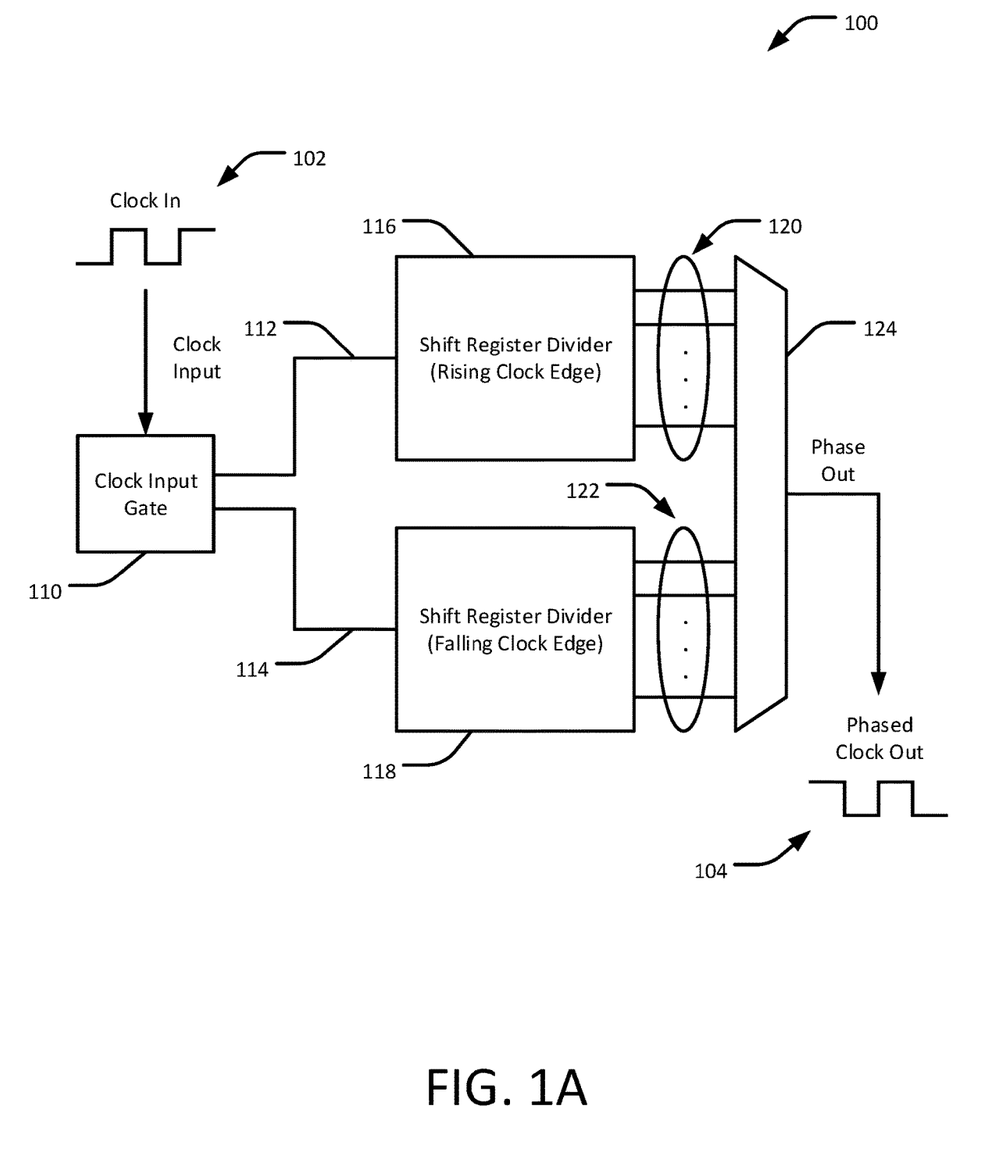
FIG. 1A is a block diagram of an example clock phase control circuit, in accordance with an embodiment of the present disclosure.
Figure 1B:
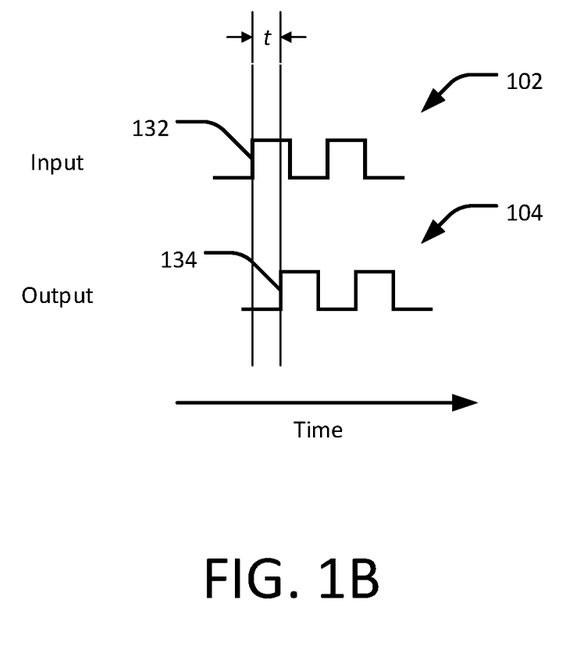
FIG. 1B is a signal timing diagram corresponding to the circuit of FIG. 1A, in accordance with an embodiment of the present disclosure.

FIGS. 1A and 1B include a block diagram of an example clock phase control circuit 100 and a corresponding signal timing diagram, respectively, in accordance with an embodiment of the present disclosure. In operation, the circuit 100 is configured to receive an input clock signal 102 and to produce an output clock signal 104 that has a different phase and/or frequency from the input clock signal 102. The circuit 100 includes a clock input gate module 110, a first shift register divider module 116, a second shift register divider module 118, and a multiplexer 124.

In some examples, the input clock signal 102 and the output clock signal 104 are both periodic, oscillating signals, such as square-wave signals. In some cases, the output clock signal 104 is the input clock signal 102 shifted in phase (i.e., delayed in time), although it will be understood that the delay can be zero such that there is no phase difference between the input clock signal 102 and the output clock signal 104. For example, as shown in the signal timing diagram of FIG. 1B, a rising edge 132 of the input clock signal 102 can occur a time t before a corresponding, phase-shifted rising edge 134 of the output clock signal 104. The amount of time t for phase-shifting the input clock signal 102 can be controlled by the circuit 100, as described in further detail below. For example, t can be zero or any positive value. Additional examples will be described with respect to FIG. 4.

Referring to FIG. 1A, in some embodiments, the clock input gate module 110 enables or disables downstream operation of the circuit 100, including turning the output clock signal 104 continuously off or on (steady state output). In some embodiments, the clock input gate module 110 routes the input clock signal 102 to either the first shift register divider module 116 or the second shift register divider module 118 via first and second intermediate clock signals 112 and 114, respectively. For example, the clock input gate module 110 can be configured to route the input clock signal 102 to the first shift register divider module 116 on a rising edge of the oscillating input clock signal 102, and to route the input clock signal 102 to the second shift register divider module 118 on a falling edge of the oscillating input clock signal 102.

Figure 2:
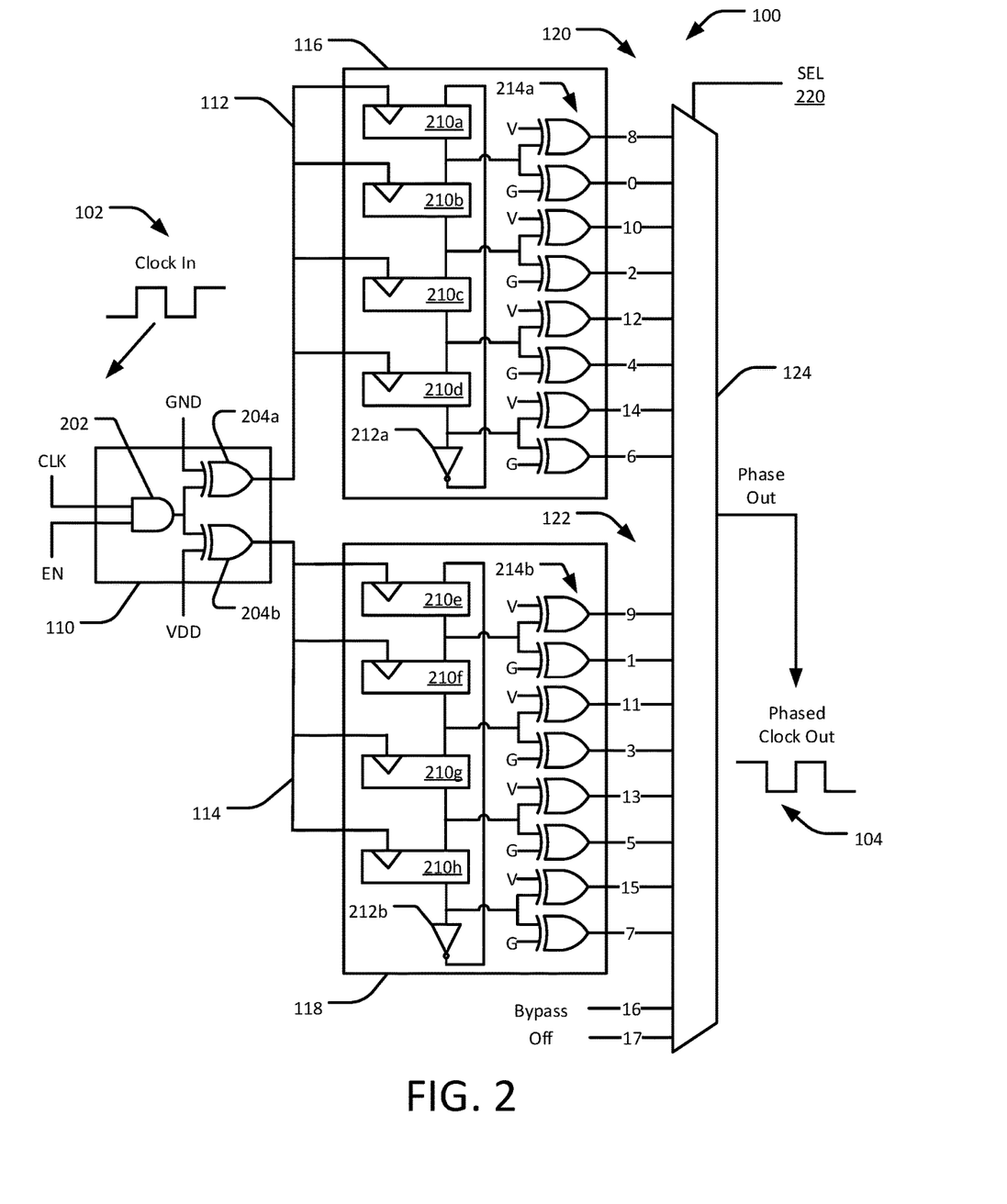
FIG. 2 is another block diagram of the example clock phase control circuit of FIG. 1A, in accordance with an embodiment of the present disclosure.

The first shift register divider module 116 and the second shift register divider module 118 each include one or more internal shift registers, such as described in further detail with respect to FIG. 2. Each of the internal shift registers is designed to store a binary value, either 0 or 1, as in a flip-flop gate. Collectively, these internal shift registers are configured as a logical frequency divider or a dual (D-type) flip-flop (DFF). For example, multiple internal shift registers can be connected in series such that the output of one register is the input to another register, such that each stage of the register is triggered by the preceding stage to change state. This cascaded trigger between stages effectively divides the frequency of the input to the first shift register divider module 116 to produce lower frequency phase clock signals 120, and similarly the input to the second shift register divider module 118 can be divided to produce lower frequency phase clock signals 122. The amount of such frequency division depends on the number of shift registers used. In some programmable configurations, the phase of the phase clock signals 120, 122 can be shifted with respect to the input clock signal 102.

The first shift register divider module 116 receives, as an input, the first intermediate clock signal 112 from the clock input gate module 110 and outputs one or more phase clock signals 120 to the multiplexer 124. As noted above, the first shift register divider module 116 is triggered on the rising edge of the oscillating input clock signal 102. Each of the phase clock signals 120 has a different (lower or divided) frequency than the first intermediate clock signal 112. However, the rising edge of the phase clock signals 120 are aligned with the rising edge of the first intermediate clock signal 112. For the first shift register divider module 116, each successive change in state of the first intermediate clock signal 112, such as a low to high state transition, triggers one or more of the internal shift registers to change from storing a 0 to a 1 or from storing a 1 to a 0. For example, if the first intermediate clock signal 112 transitions from low to high and one of the internal shift registers is currently storing a 0, the shift register stores a 1. Likewise, if the first intermediate clock signal 112 transitions from low to high and one of the internal shift registers is currently storing a 1, the shift register stores a 0. It will be understood that the internal shift registers can alternatively be configured to change state when the first intermediate clock signal 112 transitions from high to low. The state of each of the internal shift registers is output to a set of gates that generates two further outputs having opposite states; that is, the outputs of the gates are either 0 and 1, or 1 and 0, depending on the output of the shift register, such as described with respect to FIG. 2. The output of the gates in the first shift register divider module 116 is one of the phase clock signals 120 to the multiplexer 124.

The second shift register divider module 118 is functionally similar to the first shift register divider module 116 but receives a different input. The second shift register divider module 118 receives, as an input, the second connection 114 from the clock input gate module 110 and outputs one or more phase clock signals 122 to the multiplexer 124. As noted above, the second shift register divider module 118 is triggered on the falling edge of the oscillating input clock signal 102. Each of the phase clock signals 122 has a different (lower or divided) frequency than the second intermediate clock signal 114. However, the rising edge of the phase clock signals 122 are aligned with the rising edge of the second intermediate clock signal 114. For the second shift register divider module 118, each successive change in state of the second intermediate clock signal 114, such as a low to high state transition, triggers one or more of the internal shift registers to change from storing a 0 to a 1 or from storing a 1 to a 0. For example, if the second intermediate clock signal 114 transitions from low to high and one of the internal shift registers is currently storing a 0, the shift register stores a 1. Likewise, if the second intermediate clock signal 114 transitions from low to high and one of the internal shift registers is currently storing a 1, the shift register stores a 0. It will be understood that the internal shift registers can alternatively be configured to change state when the second intermediate clock signal 114 transitions from high to low. The state of each of the internal shift registers is output to a set of gates that generates two further outputs having opposite states; that is, the outputs of the gates are either 0 and 1, or 1 and 0, depending on the output of the shift register, such as described with respect to FIG. 2. The output of the gates in the second shift register divider module 118 is one of the phase clock signals 122 to the multiplexer 124.

As noted above, the first shift register divider module 116 is connected to the first intermediate clock signal 112 and produces the phase clock signals 120, and the second shift register divider module 118 is connected to the second intermediate clock signal 114 and produces the phase clock signals 122, as shown in FIG. 1A. Because in some embodiments the first intermediate clock signal 112 and the second intermediate clock signal 114 are logically opposite of each other, the phase clock signals 120 produced by the first shift register divider module 116 are out-of-phase with the phase clock signals 122 produced by the second shift register divider module 118. Furthermore, when the first and second shift register dividers 116 and 118 each include multiple shift registers (e.g., flip-flops), each of the phase clock signals 120 out of the first shift register divider module 116 oscillate at different phases, and each of the phase clock signals 122 out of the second shift register divider module 118 oscillate at different phases, such as described with respect to FIG. 4.

The multiplexer 124 is used to select any one of the phase clock signals 120 and 122 to output as the output clock signal 104. Although a single multiplexer 124 is shown in FIG. 1A, it will be understood that the multiplexer 124 can be replaced with multiple multiplexers in series and/or parallel arrangements. For example, the multiplexer 124 can include two 9-to-1 multiplexers in parallel with each other, and a 2-input multiplexer in series with the outputs of the two 9-to-1 multiplexers. Other arrangements will be apparent in light of this disclosure.

FIG. 2 is a block diagram of the example clock phase control circuit 100 in further detail, in accordance with an embodiment. The clock input gate module 110 includes a logical AND gate 202 in series with two logical exclusive-OR (XOR) gates 204a, 204b, which are in parallel and allow all the phase delays output by the circuit 100 to be synchronized to the input clock signal 102. The input clock signal 202 (CLK) and an enable (EN) signal are inputs to the AND gate 202. The output of the AND gate 202 is an input to both of the XOR gates 204a and 204b. The other input of the XOR gate 204a is a logical zero (GND), and the other input of the XOR gate 204b is a logical one (VDD). The output of the XOR gate 204a is the first intermediate clock signal 112, and the output of the XOR gate 204b is the second intermediate clock signal 114. This has the effect of causing the first intermediate clock signal 112 to be 180 degrees out-of-phase with respect to the second intermediate clock signal 114, as discussed with respect to FIG. 3 below. It will be appreciated by one of skill in the art that other configurations can be used to produce other (non-180 degree) phase differences between the first and second intermediate clock signals 112 and 114.

Figure 3:
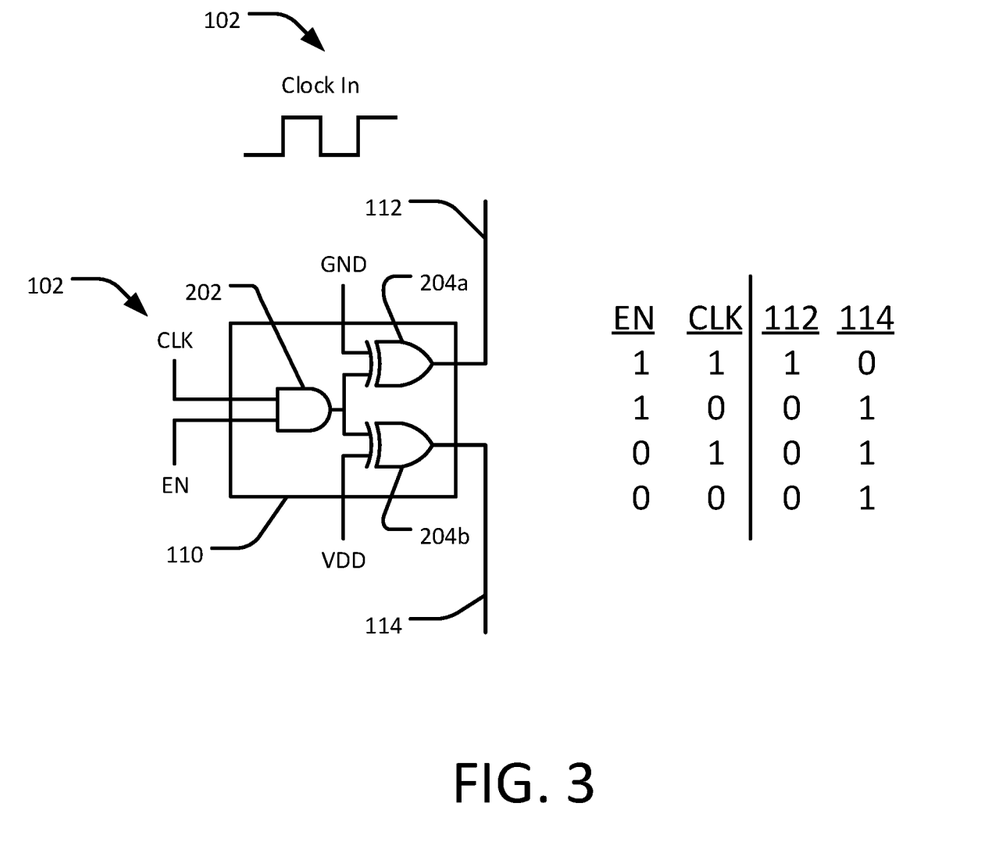
FIG. 3 is a logical truth table representing the operation of a portion of the circuit of FIG. 2, in accordance with an embodiment of the present disclosure.

FIG. 3 is a logical truth table representing the operation of the clock input gate module 110 of FIG. 2. As can be seen, when EN is 1 (high) and CLK is 1 (high), the first intermediate clock signal 112 is 1 (high) and the second intermediate clock signal 114 is 0 (low). When EN is 1 (high) and CLK is 0 (low), the first intermediate clock signal 112 is 0 (low) and the second intermediate clock signal 114 is 1 (high). Thus, the first intermediate clock signal 112 is 180 degrees out-of-phase with respect to the second intermediate clock signal 114. When EN is 0 (low), CLK becomes a Don't Care condition, and the first intermediate clock signal 112 is 0 (low) and the second intermediate clock signal 114 is 1 (high). It will be understood that in some embodiments, the enable signal and the AND gate 202 can be deleted from the circuit 100 when this function is not used or desired. In this configuration, the circuit 100 behaves as if EN is 1.

Referring again to FIG. 2, the first shift register divider module 116 and the second shift register divider module 118 each include four internal shift registers 210a, 210b, 210c, 210d, and 210e, 210f, 210g, and 210h, respectively. The use of four internal shift registers in each shift register divider module 116 and 118 provides two divide-by-four shift register divider circuits, which in combination provides a divide-by-eight shift register divider. As a result, and as described below, the frequency of the output clock signal 104 will be one-fourth of the frequency of the input clock signal 102. It will be understood that the first and second shift register dividers 116 and 118 can include any number of internal shift registers, such as 4, 8, 12, 16, etc., to provide different output frequencies and phases, as desired.

Each of the internal shift registers 210a-h is configured to store a binary value, either 0 or 1, operating as a flip-flop. Collectively, these internal shift registers are arranged as a logical divider by including an inverter (NOT) gate 212a, 212b between the output of the last stage (e.g., 210d, 210h) and the input of the first stage (e.g., 210a, 210e). For example, the internal shift registers 210a-d can be connected in series such that the output of one register (e.g., 210a) is the input to another register (e.g., 210b), such that, when triggered by the clock input gate module 110, each stage of the shift register divider changes to the state of the preceding stage. In some embodiments, the location of the inverter gate 212a, 212b is programmable or otherwise modifiable to set the number of actively used internal shift registers (e.g., 4, 8, 12, etc.), thus changing the amount of frequency division and/or phase shifting produced by the circuit 100 accordingly. For example, the inverter gate 212a can be located between internal shift registers 210a and 210b, between 210b and 210c, between 210c and 210d, or downstream of 210d as shown, with the output of the inverter gate 212a connected to the input of the first stage (e.g., 210a).

Each of the internal shift registers 210a-210d in the first shift register divider module 116 receives, as a triggering input, the first intermediate clock signal 112 from the clock input gate module 110 and outputs one or more phase clock signals 120 to the multiplexer 124 via a pair of XOR gates 214a. Each pair of the XOR gates 214a provides logically opposite outputs that are, for example, 180 degrees out-of-phase: one XOR gate in the pair will always be 0 (low) when the other XOR gate in the pair is 1 (high). In this manner, the output of each stage 210a-d provides two different phases which are clocked by the first intermediate clock signal 112. Likewise, each of the internal shift registers 210e-210h in the second shift register divider module 118 receives, as a triggering input, the second intermediate clock signal 114 from the clock input gate module 110 and outputs one or more phase clock signals 122 to the multiplexer 124 via a pair of XOR gates 214b. Each pair of the XOR gates 214b provides logically opposite outputs: one XOR gate in the pair will always be 0 (low) when the other XOR gate in the pair is 1 (high). In this manner, the output of each stage 210e-h provides two different phases which are clocked by the second intermediate clock signal 114. Since the first and second intermediate clock signals 112 and 114 are 180 degrees out-of-phase with respect to each other, the respective phase clock signals 120 and 122 are also out-of-phase with respect to each other.

For the first shift register divider module 116, each successive change in state of the first intermediate clock signal 112, such as a low to high state transition, triggers one or more of the internal shift registers 210a-d to change from storing a 0 to a 1 or from storing a 1 to a 0. For example, if the first intermediate clock signal 112 transitions from low to high and one of the internal shift registers 210a-d is currently storing a 0, the shift register stores a 1 if the preceding stage is storing a 1. Likewise, if the first intermediate clock signal 112 transitions from low to high and one of the internal shift registers 210a-d is currently storing a 1, the shift register stores a 0 if the preceding stage is storing a 0. The inverter gate 212a causes each of the internal shift registers 210a-d to change from 0 to 1 or from 1 to 0 every four clock cycles, in the example of FIG. 2 where there are four internal shift registers. Likewise, the inverter gate 212b causes each of the internal shift registers 210e-h to change from 0 to 1 or from 1 to 0 every four clock cycles, in the example of FIG. 2. It will be understood that the internal shift registers 210a-d can alternatively be configured to change state when the first intermediate clock signal 112 transitions from high to low.

The state of each of the internal shift registers 210a-d and 210e-g is output to the set of gate pairs 214a and 214b, which generates two further outputs having opposite states; that is, the outputs of each pair of the gates 214a and 214b are either 0 and 1, or 1 and 0, depending on the output of the corresponding shift register 210a-d. The output of the gates 214a in the first shift register divider module 116 are the phase clock signals 120 output to the multiplexer 124. The phase clock signals 120 from the first shift register divider module 116 are labeled as Phases 8, 0, 10, 2, 12, 4, 14, and 6. Similarly, the second shift register divider module 118 operates in the same way as the first shift register divider module 116, where the output of the gates 214b are the phase clock signals 122 output to the multiplexer 124. The phase clock signals 122 from the second shift register divider module 118 are labeled as Phases 9, 1, 11, 3, 13, 5, 15, and 7. Additionally, in some embodiments, the multiplexer 124 has two additional inputs: Phase 16 (bypass) and Phase 17 (off). In this example, when Phase 16 (bypass) is high, the output clock signal 104 follows the input clock signal 102 with no phase offset (no delay). When Phase 16 is low, the output clock signal 104 follows the Phase 0-15 signals 120, 122 corresponding to the multiplexer select signal 220, which causes the multiplexer 124 to pass those signals through. When Phase 17 (off) is high, the output clock signal 104 is in a steady state (either high or low). When Phase 17 (off) is low, the output clock signal 104 operates as described above.

Example Clock Signal Timing

Figure 4:
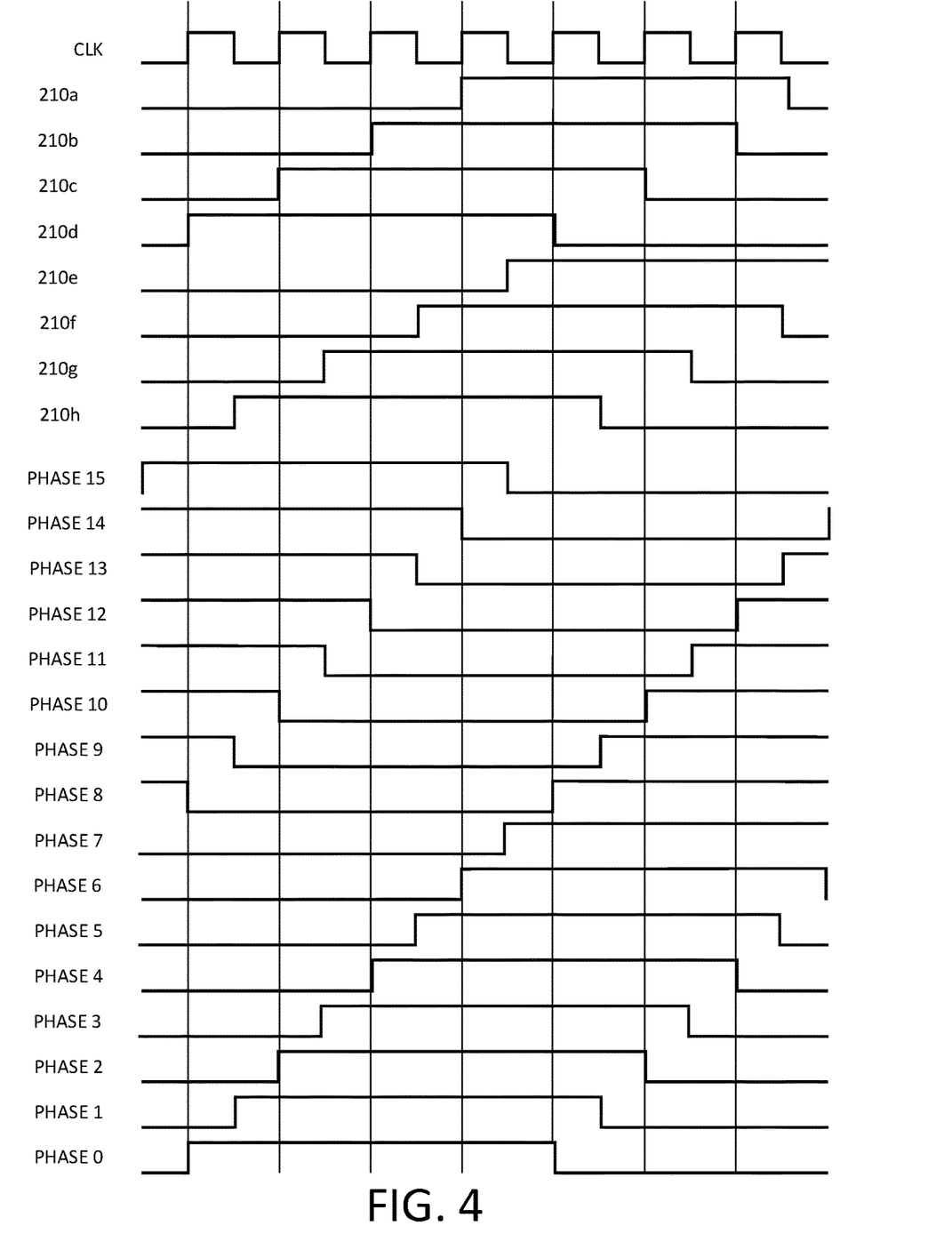
FIG. 4 is an example clock timing diagram representing an operation of the circuit of FIG. 2, in accordance with an embodiment of the present disclosure.

FIG. 4 is an example clock timing diagram of the operation of the circuit 100 of FIG. 2, in accordance with an embodiment. In FIG. 4, the horizontal axis represents time and the vertical axis represents the logical state (high/1 or low/0) of each signal in the diagram. As noted above, in some examples the input clock signal (CLK) is an oscillating square wave, as shown in FIG. 4. Upon the first rising edge of CLK, the shift register 210d changes from 0 to 1; upon the second rising edge of CLK, the shift register 210c changes from 0 to 1; and so forth as indicated. Similarly, upon the first falling edge of CLK, the shift register 210h changes from 0 to 1; upon the second falling edge of CLK, the shift register 210g changes from 0 to 1; and so forth as indicated. Phase 0 follows the shift register 210d (rising edge of CLK); Phase 1 follows the shift register 210h (falling edge of CLK); and so forth as indicated. In this manner, any of the Phases 0-15 can be output by the circuit 100 as the output clock signal 104 by selecting the corresponding input of the multiplexer 124. In this example, there are 16 different selectable phases, as shown in FIG. 4. The phase is, in some embodiments, user-selectable according to the desired output phase of the circuit. In some cases, the user can additionally disable the output (e.g., turn it off) or bypass the circuit so that the output clock signal 104 has the same phase as the input clock signal 102.

Example Physical Layouts

Figure 5:
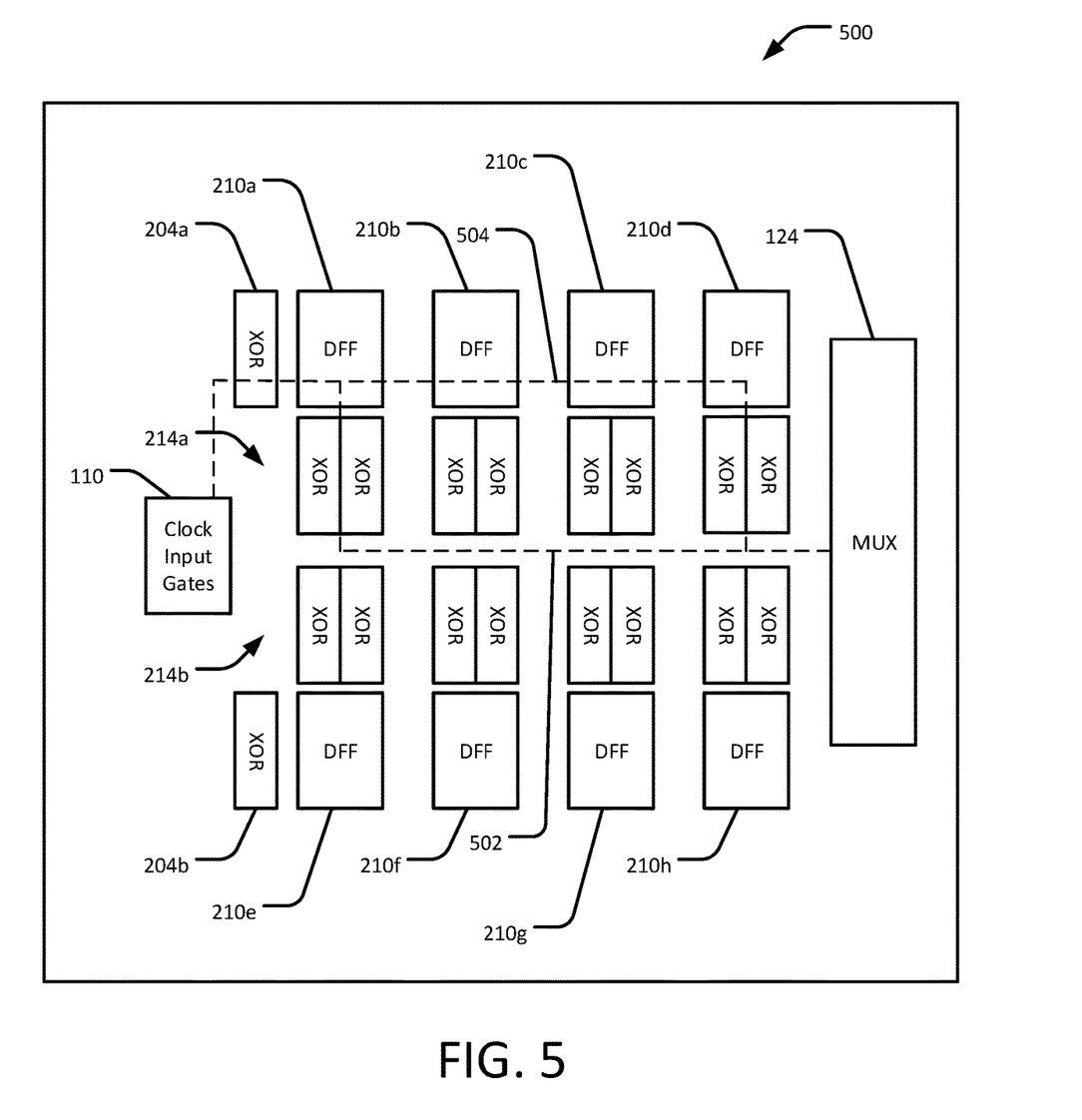
FIG. 5 is a schematic diagram of an example physical layout of the circuit of FIG. 2, in accordance with an embodiment of the present disclosure.

FIG. 5 is a schematic diagram of an example physical layout 500 of the circuit 100 of FIG. 2, in accordance with an embodiment of the present disclosure. It will be understood that FIG. 5 is not drawn to scale, but rather is intended to show the relative positions of the various components of the circuit 100. The physical layout 500 can be fabricated, for example, on a semiconductor substrate or other suitable material. As shown, the clock input gates 110 and XOR gates 204a, 204b are positioned on one side, the multiplexer 124 is positioned on the opposite side from the clock input gates 110, and the internal shift registers 210a-h and corresponding XOR gates 214a, 214b are positioned in between the clock input gates 110 and the multiplexer 124. In this manner, the length of the signal path through any portion of the layout 500 is the same. For example, in this example layout 500, a length of a first signal path 502 (represented by a dashed line) from the clock input gates 110, then through the XOR gate 204a, then through the internal shift register 210a, then through the corresponding XOR gates 214a to the multiplexer 124 is the same (or substantially the same) as a length of a second signal path 504 (represented by a dashed line) from the clock input gates 110, then through the XOR gate 204a, then through the internal shift register 210d, then through the corresponding XOR gates 214a to the multiplexer 124. By having the same or similar signal path lengths, the signal propagation delays are the same or nearly the same throughout the circuit 100 during operation. In some examples, the height of the layout 500 (measured from the bottom of FIG. 5 to the top) is approximately 45 microns.

Figure 6:
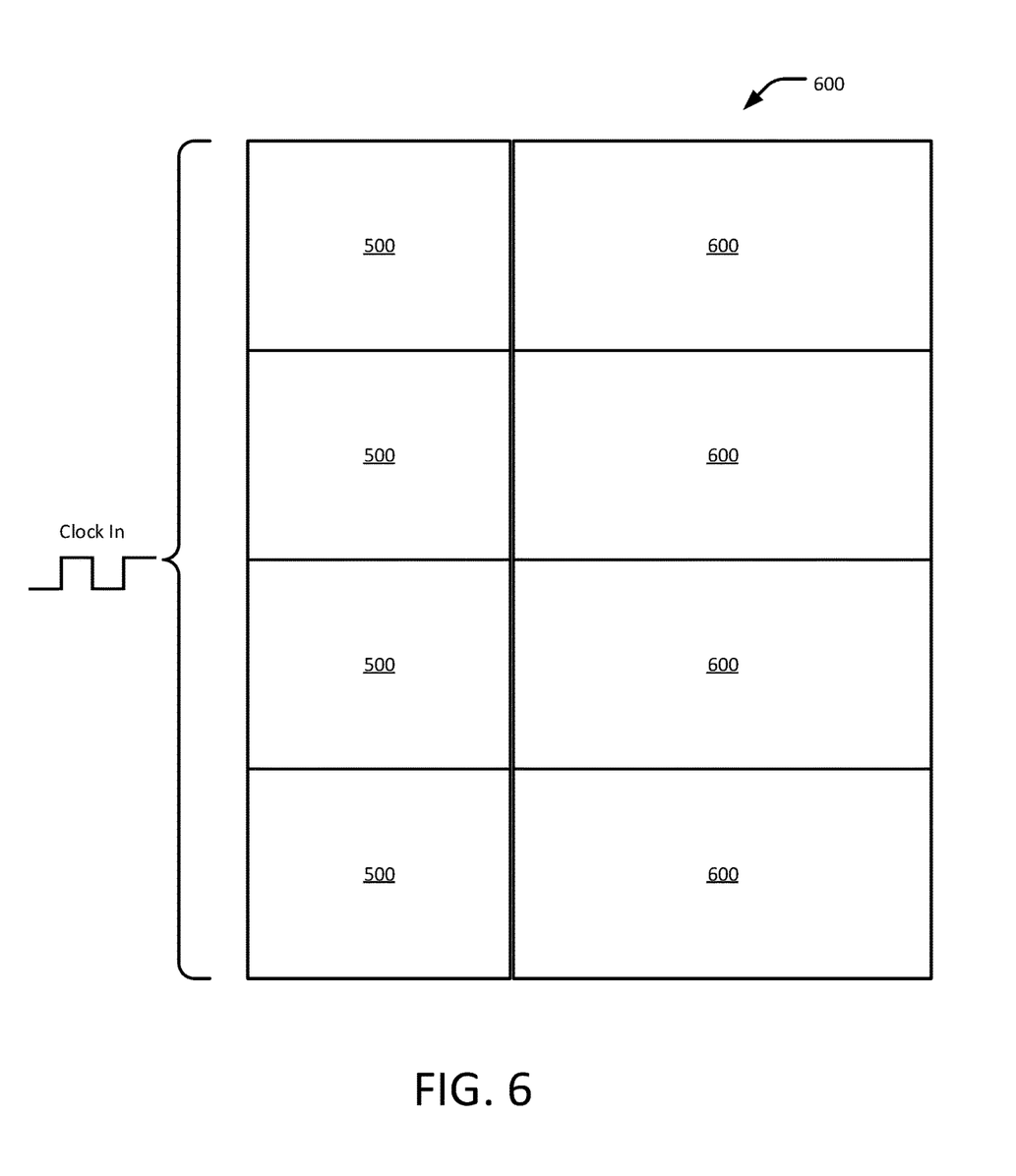
FIG. 6 is a schematic diagram of another example physical layout of the circuit of FIG. 2, in accordance with an embodiment of the present disclosure.

FIG. 6 is a schematic diagram of another example physical layout 600 of the circuit 100 of FIG. 2, in accordance with an embodiment of the present disclosure. It will be understood that FIG. 6 is not drawn to scale, but rather is intended to show the relative positions of the various components of the circuit 100. The physical layout 600 can be fabricated, for example, on a semiconductor substrate or other suitable material. In FIG. 6, one or more of the circuit layouts 500 of FIG. 5 can be positioned adjacent to one or more corresponding input/output pad (PAD I/O) circuit(s) 600 for interfacing the circuit(s) 100 with one or more other circuits. These other circuits may, for example, be chips, display devices, transducers, or electro-mechanical devices. The pad(s) 600 are positioned near one edge of the layout(s) 500, as will be understood by one of skill in the art. In some examples, the height of the layout 500 is approximately the same as the height of the adjacent pad 600 (e.g., about 45 microns). In some embodiments, a single common input clock signal is provided to each layout 500 for improved control of the clock phases output by each of the layouts 500.

Example Methodology

Figure 7:
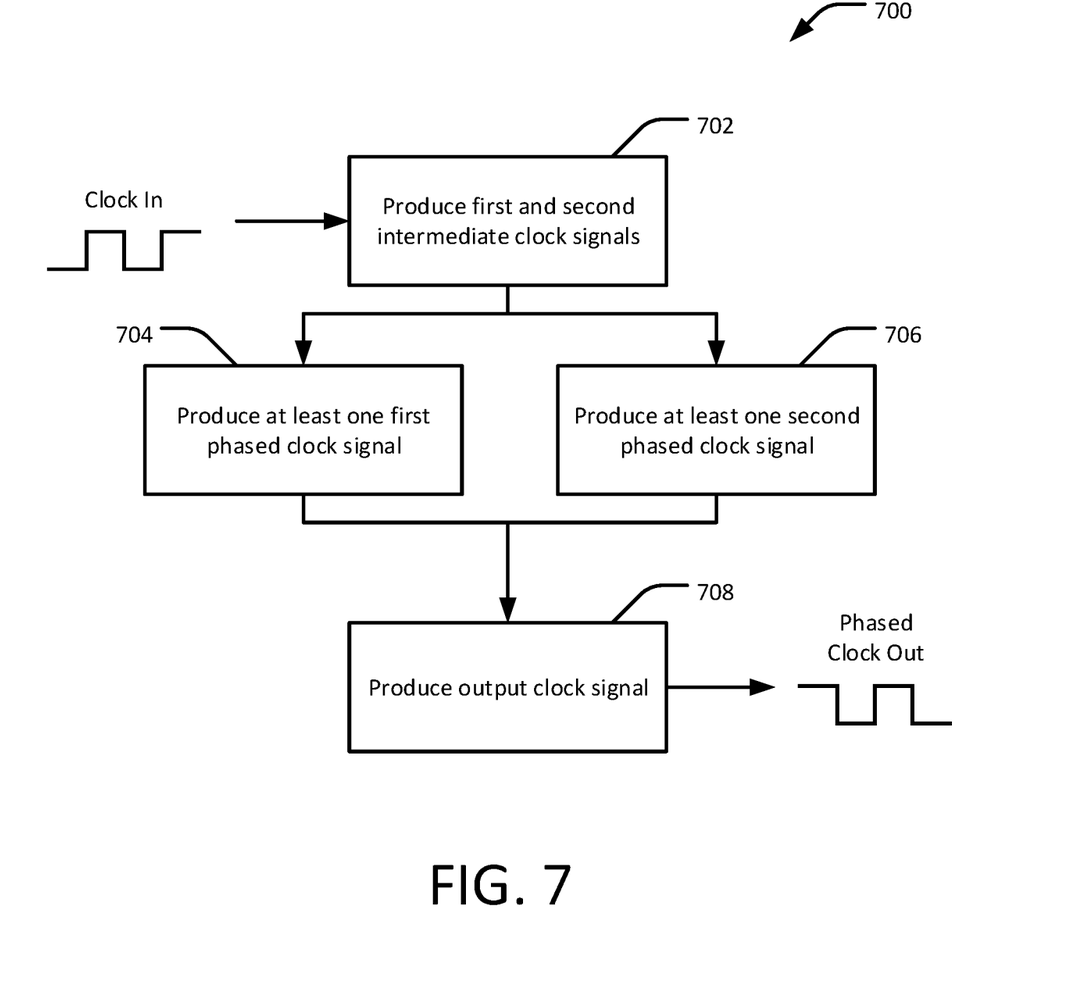
FIG. 7 is a flow diagram of a method for producing an output clock signal from an input clock signal, in accordance with an embodiment of the present disclosure.

FIG. 7 is a flow diagram of a method 700 for producing an output clock signal from an input clock signal, in accordance with an embodiment of the present disclosure. The method 700 can be implemented, for example, by the circuit 100 of FIG. 1A or 2, or in the layout 500 of FIGS. 5 and 6. The method 700 includes producing 702, using a clock input gate module and based on an oscillating input clock signal, a first intermediate clock signal and a second intermediate clock signal. In some examples, the clock input gate module can be or include the clock input gate module 110 of FIG. 2. In some examples, the oscillating input clock signal can be a periodic square wave signal, such as shown in FIG. 4. In some examples, the first intermediate clock signal is 180 degrees out-of-phase with respect to the second intermediate clock signal.

The method 700 further includes producing 704, using a first shift register divider module, at least one first phase clock signal based on the first intermediate clock signal. The at least one first phase clock signal has a different frequency than the first intermediate clock signal. For example, the at least one first phase clock signal can have a lower frequency than the first intermediate clock signal, such as shown in FIG. 4. In some examples, the first shift register divider module can be or include the first shift register divider module 116 of FIG. 2.

The method 700 further includes producing 706, using a second shift register divider module, at least one second phase clock signal based on the second intermediate clock signal. The at least one second phase clock signal has a different frequency than the second intermediate clock signal. For example, the at least one second phase clock signal can have a lower frequency than the second intermediate clock signal, such as shown in FIG. 4. In some examples, the second shift register divider module can be or include the second shift register divider module 118 of FIG. 2.

In some examples, the first shift register divider module includes a plurality of first shift registers configured as a first frequency divider, and the second shift register divider module includes a plurality of second shift registers configured as a second frequency divider. In these examples, the method 700 includes reducing, using the first frequency divider, a frequency of the first intermediate clock signal to produce the at least one first phase clock signal, and reducing, using the second frequency divider, a frequency of the second intermediate clock signal to produce the at least one second phase clock signal.

The method 700 further includes producing, using a multiplexer, an output clock signal by selecting one of the at least one first phase clock signal and the at least one second phase clock signal.

In some examples, the clock input gate module includes an and (AND) gate arranged in series with first and second exclusive-or (XOR) gates, where the first and second XOR gates are arranged in parallel with each other, such as shown in FIG. 2. In these examples, an input of the AND gate is connected to the input clock signal (e.g., CLK in FIG. 2), an input of the first XOR gate is connected to a logically low signal (e.g., GND in FIG. 2), an output of the first XOR gate is connected to the first intermediate clock signal (e.g., signal 112 of FIG. 2), an input of the second XOR gate is connected to a logically high signal (e.g., VDD in FIG. 2), and an output of the second XOR gate is connected to the second intermediate clock signal (e.g., signal 114 of FIG. 2).

In some examples, the first shift register divider module includes at least one first shift register in series with first and second exclusive-or (XOR) gates. The first and second XOR gates are arranged in parallel with each other, such as shown in FIG. 2. An input of the first XOR gate is connected to a logically low signal (e.g., Gin FIG. 2). An output of the first XOR gate is connected to a first input of the multiplexer (e.g., Phase 0, 2, 4, or 6 in FIG. 2). An input of the second XOR gate is connected to a logically high signal (e.g., V in FIG. 2). An output of the second XOR gate is connected to a second input of the multiplexer (e.g., Phase 8, 10, 12, or 14 of FIG. 2).

In some examples, the second shift register divider module includes at least one second shift register in series with third and fourth exclusive-or (XOR) gates. The third and fourth XOR gates are arranged in parallel with each other, such as shown in FIG. 2. An input of the third XOR gate is connected to a logically low signal (e.g., Gin FIG. 2). An output of the third XOR gate is connected to a third input of the multiplexer (e.g., Phase 1, 3, 5, or 7 of FIG. 2). An input of the fourth XOR gate is connected to a logically high signal (e.g., V in FIG. 2.). An output of the fourth XOR gate is connected to a fourth input of the multiplexer (e.g., Phase 9, 11, 13, or 15 of FIG. 2).

ADDITIONAL EXAMPLES

Numerous embodiments will be apparent in light of the present disclosure, and features described herein can be combined in any number of configurations.

Example 1 provides a clock phase control circuit including a clock input gate module configured to produce, based on an oscillating input clock signal, a first intermediate clock signal and a second intermediate clock signal; a first shift register divider module configured to produce at least one first phase clock signal based on the first intermediate clock signal, the at least one first phase clock signal having a different frequency than the first intermediate clock signal; a second shift register divider module configured to produce at least one second phase clock signal based on the second intermediate clock signal, the at least one second phase clock signal having a different frequency than the second intermediate clock signal; and a multiplexer configured to produce an output clock signal by selecting one of the at least one first phase clock signal and the at least one second phase clock signal.

Example 2 includes the subject matter of Example 1, where the clock input gate module is configured to produce the first intermediate clock signal 180 degrees out-of-phase with respect to the second intermediate clock signal.

Example 3 includes the subject matter of any of Examples 1-2, where the first shift register divider module includes a plurality of first shift registers configured as a first frequency divider, where the first frequency divider reduces a frequency of the first intermediate clock signal to produce the at least one first phase clock signal, and the second shift register divider module includes a plurality of second shift registers configured as a second frequency divider, where the second frequency divider reduces a frequency of the second intermediate clock signal to produce the at least one second phase clock signal.

Example 4 includes the subject matter of any of Examples 1-3, where the clock input gate module includes an and (AND) gate arranged in series with first and second exclusive-or (XOR) gates, the first and second XOR gates arranged in parallel with each other, where an input of the AND gate is connected to the input clock signal, an input of the first XOR gate is connected to a logically low signal, an output of the first XOR gate is connected to the first intermediate clock signal, an input of the second XOR gate is connected to a logically high signal, and an output of the second XOR gate is connected to the second intermediate clock signal.

Example 5 includes the subject matter of any of Examples 1-4, where the first shift register divider module includes at least one first shift register in series with first and second exclusive-or (XOR) gates, the first and second XOR gates arranged in parallel with each other, where an input of the first XOR gate is connected to a logically low signal, an output of the first XOR gate is connected to a first input of the multiplexer, an input of the second XOR gate is connected to a logically high signal, and an output of the second XOR gate is connected to a second input of the multiplexer.

Example 6 includes the subject matter of Example 5, where the second shift register divider module includes at least one second shift register in series with third and fourth exclusive-or (XOR) gates, the third and fourth XOR gates arranged in parallel with each other, where an input of the third XOR gate is connected to a logically low signal, an output of the third XOR gate is connected to a third input of the multiplexer, an input of the fourth XOR gate is connected to a logically high signal, and an output of the fourth XOR gate is connected to a fourth input of the multiplexer.

Example 7 includes the subject matter of any of Examples 1-6, where the at least one first shift register includes a D-type flip-flop.

Example 8 provides a clock phase control circuit including a shift register divider module including a plurality of shift registers configured as a frequency divider to produce one or more phase clock signals based on an oscillating input clock signal, each of the one or more phase clock signals having a different frequency than the input clock signal; and a multiplexer configured to produce an output clock signal by selecting one of the one or more phase clock signals.

Example 9 includes the subject matter of Example 8, where the shift register divider module includes at least one shift register in series with first and second exclusive-or (XOR) gates, the first and second XOR gates arranged in parallel with each other, where an input of the first XOR gate is connected to a logically low signal, an output of the first XOR gate is connected to a first input of the multiplexer, an input of the second XOR gate is connected to a logically high signal, and an output of the second XOR gate is connected to a second input of the multiplexer.

Example 10 includes the subject matter of any of Examples 8-9, where the circuit includes a plurality of shift register divider modules each configured to produce two or more phase clock signals based on the input clock signal, each of the two or more phase clock signals having a different frequency than the input clock signal, where the multiplexer is further configured to produce the output clock signal by selecting one of the two or more phase clock signals.

Example 11 includes the subject matter of Example 10, where the circuit includes a clock input gate module configured to produce, based on the input clock signal, a first intermediate clock signal and a second intermediate clock signal, the first intermediate clock signal being out-of-phase with respect to the second intermediate clock signal, where at least one of the plurality of shift register divider modules is configured to produce at least one of the two or more phase clock signals using the first intermediate clock signal, and at least one of the plurality of shift register divider modules is configured to produce at least one of the two or more phase clock signals using the second intermediate clock signal.

Example 12 includes the subject matter of Example 11, where the clock input gate module is configured to produce the first intermediate clock signal 180 degrees out-of-phase with respect to the second intermediate clock signal.

Example 13 includes the subject matter of any of Examples 11-12, where the clock input gate module includes an and (AND) gate arranged in series with first and second exclusive-or (XOR) gates, the first and second XOR gates arranged in parallel with each other, where an input of the AND gate is connected to the input clock signal, an input of the first XOR gate is connected to a logically low signal, an output of the first XOR gate is connected to the first intermediate clock signal, an input of the second XOR gate is connected to a logically high signal, and an output of the second XOR gate is connected to the second intermediate clock signal.

Example 14 provides a method of producing a phase clock signal, the method including producing, using a clock input gate module and based on an oscillating input clock signal, a first intermediate clock signal and a second intermediate clock signal; producing, using a first shift register divider module, at least one first phase clock signal based on the first intermediate clock signal, the at least one first phase clock signal having a different frequency than the first intermediate clock signal; producing, using a second shift register divider module, at least one second phase clock signal based on the second intermediate clock signal, the at least one second phase clock signal having a different frequency than the second intermediate clock signal; and producing, using a multiplexer, an output clock signal by selecting one of the at least one first phase clock signal and the at least one second phase clock signal.

Example 15 includes the subject matter of Example 14, where the method includes producing, using the clock input gate module, the first intermediate clock signal 180 degrees out-of-phase with respect to the second intermediate clock signal.

Example 16 includes the subject matter of any of Examples 14-15, where the first shift register divider module includes a plurality of first shift registers configured as a first frequency divider, where the second shift register divider module includes a plurality of second shift registers configured as a second frequency divider, and where the method includes reducing, using the first frequency divider, a frequency of the first intermediate clock signal to produce the at least one first phase clock signal; and reducing, using the second frequency divider, a frequency of the second intermediate clock signal to produce the at least one second phase clock signal.

Example 17 includes the subject matter of any of Examples 14-16, where the clock input gate module includes an and (AND) gate arranged in series with first and second exclusive-or (XOR) gates, the first and second XOR gates arranged in parallel with each other, where an input of the AND gate is connected to the input clock signal, an input of the first XOR gate is connected to a logically low signal, an output of the first XOR gate is connected to the first intermediate clock signal, an input of the second XOR gate is connected to a logically high signal, and an output of the second XOR gate is connected to the second intermediate clock signal.

Example 18 includes the subject matter of any of Examples 14-17, where the first shift register divider module includes at least one first shift register in series with first and second exclusive-or (XOR) gates, the first and second XOR gates arranged in parallel with each other, where an input of the first XOR gate is connected to a logically low signal, an output of the first XOR gate is connected to a first input of the multiplexer, an input of the second XOR gate is connected to a logically high signal, and an output of the second XOR gate is connected to a second input of the multiplexer.

Example 19 includes the subject matter of Example 18, where the second shift register divider module includes at least one second shift register in series with third and fourth exclusive-or (XOR) gates, the third and fourth XOR gates arranged in parallel with each other, where an input of the third XOR gate is connected to a logically low signal, an output of the third XOR gate is connected to a third input of the multiplexer, an input of the fourth XOR gate is connected to a logically high signal, and an output of the fourth XOR gate is connected to a fourth input of the multiplexer.

Example 20 includes the subject matter of any of Examples 14-19, where the at least one first shift register includes a D-type flip-flop.

Example 21 includes the subject matter of any of Examples 14-19, where the one of the at least one first phase clock signal and the at least one second phase clock signal is user-selectable via the multiplexer using a multiplexer select signal.

The foregoing description and drawings of various embodiments are presented by way of example only. These examples are not intended to be exhaustive or to limit the invention to the precise forms disclosed. Alterations, modifications, and variations will be apparent in light of this disclosure and are intended to be within the scope of the invention as set forth in the claims.

What is claimed is:
1. A clock phase control circuit, comprising:
a clock input gate module configured to produce, based on an oscillating input clock signal, a first intermediate clock signal and a second intermediate clock signal;
a first shift register divider module configured to produce at least one first phase clock signal based on the first intermediate clock signal, the at least one first phase clock signal having a different frequency than the first intermediate clock signal;

a second shift register divider module configured to produce at least one second phase clock signal based on the second intermediate clock signal, the at least one second phase clock signal having a different frequency than the second intermediate clock signal; and a multiplexer configured to produce an output clock signal by selecting one of the at least one first phase clock signal and the at least one second phase clock signal.

2. The circuit of claim 1, wherein the clock input gate module is configured to produce the first intermediate clock signal 180 degrees out-of-phase with respect to the second intermediate clock signal.

3. The circuit of claim 1, wherein the first shift register divider module comprises a plurality of first shift registers configured as a first frequency divider, wherein the first frequency divider reduces a frequency of the first intermediate clock signal to produce the at least one first phase clock signal, and wherein the second shift register divider module comprises a plurality of second shift registers configured as a second frequency divider, wherein the second frequency divider reduces a frequency of the second intermediate clock signal to produce the at least one second phase clock signal.

4. The circuit of claim 1, wherein the clock input gate module comprises an and (AND) gate arranged in series with first and second exclusive-or (XOR) gates, the first and second XOR gates arranged in parallel with each other, wherein an input of the AND gate is connected to the input clock signal, wherein an input of the first XOR gate is connected to a logically low signal, wherein an output of the first XOR gate is connected to the first intermediate clock signal, wherein an input of the second XOR gate is connected to a logically high signal, and wherein an output of the second XOR gate is connected to the second intermediate clock signal.

5. The circuit of claim 1, wherein the first shift register divider module comprises at least one first shift register in series with first and second exclusive-or (XOR) gates, the first and second XOR gates arranged in parallel with each other, wherein an input of the first XOR gate is connected to a logically low signal, wherein an output of the first XOR gate is connected to a first input of the multiplexer, wherein an input of the second XOR gate is connected to a logically high signal, and wherein an output of the second XOR gate is connected to a second input of the multiplexer.

6. The circuit of claim 5, wherein the second shift register divider module comprises at least one second shift register in series with third and fourth exclusive-or (XOR) gates, the third and fourth XOR gates arranged in parallel with each other, wherein an input of the third XOR gate is connected to the logically low signal, wherein an output of the third XOR gate is connected to a third input of the multiplexer, wherein an input of the fourth XOR gate is connected to the logically high signal, and wherein an output of the fourth XOR gate is connected to a fourth input of the multiplexer.

7. The circuit of claim 5, wherein the at least one first shift register includes a D-type flip-flop.

8. A clock phase control circuit, comprising:
a shift register divider module including a plurality of shift registers configured as a frequency divider to produce one or more phase clock signals based on an oscillating input clock signal, each of the one or more phase clock signals having a different frequency than the input clock signal; and a multiplexer configured to produce an output clock signal by selecting one of the one or more phase clock signals wherein the shift register divider module comprises at least one shift register in series with first and second exclusive-or (XOR) gates, the first and second XOR gates arranged in parallel with each other, wherein an input of the first XOR gate is connected to a logically low signal, wherein an output of the first XOR gate is connected to a first input of the multiplexer, wherein an input of the second XOR gate is connected to a logically high signal, and wherein an output of the second XOR gate is connected to a second input of the multiplexer.

9. The circuit of claim 8, further comprising additional shift register divider modules each configured to produce two or more additional phase clock signals based on the input clock signal, each of the additional two or more phase clock signals having a different frequency than the input clock signal, wherein the multiplexer is further configured to produce the output clock signal by selecting one of the additional two or more phase clock signals.

10. The circuit of claim 9, further comprising a clock input gate module configured to produce, based on the input clock signal, a first intermediate clock signal and a second intermediate clock signal, the first intermediate clock signal being out-of-phase with respect to the second intermediate clock signal, wherein at least one of the additional shift register divider modules is configured to produce at least one of the two or more additional phase clock signals using the first intermediate clock signal, and wherein at least one of the additional shift register divider modules is configured to produce at least one of the two or more additional phase clock signals using the second intermediate clock signal.

11. The circuit of claim 10, wherein the clock input gate module is configured to produce the first intermediate clock signal 180 degrees out-of-phase with respect to the second intermediate clock signal.

12. The circuit of claim 10, wherein the clock input gate module comprises an and (AND) gate arranged in series with first and second exclusive-or (XOR) gates, the first and second XOR gates arranged in parallel with each other, wherein an input of the AND gate is connected to the input clock signal, wherein an input of the first XOR gate is connected to a logically low signal, wherein an output of the first XOR gate is connected to the first intermediate clock signal, wherein an input of the second XOR gate is connected to a logically high signal, and wherein an output of the second XOR gate is connected to the second intermediate clock signal.

13. A method of producing a phase clock signal, the method comprising:
producing, using a clock input gate module and based on an oscillating input clock signal, a first intermediate clock signal and a second intermediate clock signal;

producing, using a first shift register divider module, at least one first phase clock signal based on the first intermediate clock signal, the at least one first phase clock signal having a different frequency than the first intermediate clock signal;

producing, using a second shift register divider module, at least one second phase clock signal based on the second intermediate clock signal, the at least one second phase clock signal having a different frequency than the second intermediate clock signal; and producing, using a multiplexer, an output clock signal by selecting one of the at least one first phase clock signal and the at least one second phase clock signal.

14. The method of claim 13, further comprising producing, using the clock input gate module, the first intermediate clock signal 180 degrees out-of-phase with respect to the second intermediate clock signal.

15. The method of claim 13, wherein the first shift register divider module comprises a plurality of first shift registers configured as a first frequency divider, wherein the second shift register divider module comprises a plurality of second shift registers configured as a second frequency divider, and wherein the method further comprises:
reducing, using the first frequency divider, a frequency of the first intermediate clock signal to produce the at least one first phase clock signal; and
reducing, using the second frequency divider, a frequency of the second intermediate clock signal to produce the at least one second phase clock signal.

16. The method of claim 13, wherein the clock input gate module comprises an and (AND) gate arranged in series with first and second exclusive-or (XOR) gates, the first and second XOR gates arranged in parallel with each other, wherein an input of the AND gate is connected to the input clock signal, wherein an input of the first XOR gate is connected to a logically low signal, wherein an output of the first XOR gate is connected to the first intermediate clock signal, wherein an input of the second XOR gate is connected to a logically high signal, and wherein an output of the second XOR gate is connected to the second intermediate clock signal.

17. The method of claim 13, wherein the first shift register divider module comprises at least one first shift register in series with first and second exclusive-or (XOR) gates, the first and second XOR gates arranged in parallel with each other, wherein an input of the first XOR gate is connected to a logically low signal, wherein an output of the first XOR gate is connected to a first input of the multiplexer, wherein an input of the second XOR gate is connected to a logically high signal, and wherein an output of the second XOR gate is connected to a second input of the multiplexer.

18. The method of claim 17, wherein the second shift register divider module comprises at least one second shift register in series with third and fourth exclusive-or (XOR) gates, the third and fourth XOR gates arranged in parallel with each other, wherein an input of the third XOR gate is connected to the logically low signal, wherein an output of the third XOR gate is connected to a third input of the multiplexer, wherein an input of the fourth XOR gate is connected to the logically high signal, and wherein an output of the fourth XOR gate is connected to a fourth input of the multiplexer.

19. The method of claim 13, wherein the one of the at least one first phase clock signal and the at least one second phase clock signal is user-selectable via the multiplexer using a multiplexer select signal.

* * * * *